United States Patent [19]
Kitazawa et al.

[11] Patent Number: 6,110,285
[45] Date of Patent: Aug. 29, 2000

[54] VERTICAL WAFER BOAT

[75] Inventors: Atsuo Kitazawa, Niigata; Hiroyuki Homma; Shuichi Takeda, both of Yamagata, all of Japan

[73] Assignee: Toshiba Ceramics Co., Ltd., Tokyo, Japan

[21] Appl. No.: 09/060,293

[22] Filed: Apr. 15, 1998

[30] Foreign Application Priority Data

Apr. 15, 1997 [JP] Japan .................................. 9-113483

[51] Int. Cl.[7] .................................................. C23C 16/00
[52] U.S. Cl. .......................... 118/715; 118/728; 118/729
[58] Field of Search .................................... 118/728, 715, 118/20, 500; 206/710, 711; 432/253, 258; 117/200

[56] References Cited

U.S. PATENT DOCUMENTS

| | | | |
|---|---|---|---|
| 5,507,873 | 4/1996 | Ishizuka et al. | 118/728 |
| 5,586,880 | 12/1996 | Ohsawa | 432/241 |
| 5,817,185 | 10/1998 | Shindo et al. | 134/25.4 |
| 5,858,103 | 1/1999 | Nakajima et al. | 118/728 |

FOREIGN PATENT DOCUMENTS

| | | |
|---|---|---|
| 6-163676 | 6/1994 | Japan . |
| 6-163676 | 10/1994 | Japan . |
| 8-107080 | 4/1996 | Japan . |

*Primary Examiner*—Benjamin L. Utech
*Assistant Examiner*—Lan Vinh
*Attorney, Agent, or Firm*—Foley & Lardner

[57] ABSTRACT

A vertical wafer boat in which a ceramic film is prevented from being peeled off and which has a long useful life is provided. Front and rear sets each consisting of two support rods 4 which are bilaterally symmetrically arranged are respectively disposed in front and rear sides between upper and lower plates 1 and 2. A number of wafer mount groove portions 3 are formed in the support rods. The plates and the support rods are made of a ceramic base material, and the surfaces are covered by a high-purity ceramic film. At least wafer mount groove portions of front right and left support rods of the front set are located in front of a center line which is perpendicular to an insertion direction of semiconductor wafers which are to be mounted on the wafer mount groove portions. Horizontal sections of the wafer mount groove portions of the support rods have a polygonal shape which does not have an acute angle of 90° or less.

8 Claims, 11 Drawing Sheets

VERTICAL WAFER BOAT

BACKGROUND OF THE INVENTION

1. Field of the Invention

The present invention relates to a vertical wafer boat which supports a number of semiconductor wafers in order to set the wafers into a furnace during a process such as oxidation of the semiconductor wafers, diffusion, or vapor phase growth, and particularly to a vertical wafer boat which is suitably used for forming a $SiO_2$ film, a $Si_3N_4$ film, a poly-Si film, or the like on the surfaces of semiconductor wafers by a method such as the LP (Low Pressure)-CVD (Chemical Vapor Deposition) method.

2. Description of the Related Art

Conventionally, as a vertical wafer boat of this kind, known is a wafer boat disclosed in Japanese patent unexamined publication (JP-A HEI-6-183676) applied by the applicant the present application.

In the wafer boat, as shown in FIGS. 15 and 16, four support rods 34 in each of which a number of wafer mount groove portions 33 are formed in one edge and which have a triangular section shape are disposed between upper and lower semi-arcuate plates 31 and 32 so that the wafer mount groove portions 33 are respectively directed to the centers of semiconductor wafers (not shown) to be mounted on the wafer mount groove portions. The plates 31 and 32, and the support rods 34 are made of SiC or SiC infiltrated by Si (Si—SiC). It is also well known that a surface of a wafer boat is covered by a high purity ceramic film in order to obtain the wafer boat having a high purity.

In the wafer boat configured as described above, since the support rods 34 have a triangular section shape, the buckling load is increased and the useful life is extended.

FIGS. 17 to 19 show another vertical wafer boat of the prior art. In the wafer boat, between upper and lower ring plate-like plates 36 and 37 in each of which a slit 35 elongating in the wafer insertion direction (in FIG. 18, from the right side to the left side) is formed in the center of the rear portion (in FIG. 18, the left side), four support rods 39 in which a number of wafer mount groove portions 38 are formed and which have a circular section shape are disposed so that the wafer mount groove portions 38 are respectively directed to the centers of semiconductor wafers "W" to be mounted on the wafer mount groove portions. The plates 36 and 37, and the support rods 39 are made of a ceramic base material and the outer surfaces of the vertical wafer boat constituted by them are covered by a high-purity ceramic film (not shown). In the support rods 39, a chamfer 40 is formed in the lower horizontal edge of each of the wafer mount groove portions 38. A projection 42 protrudes from the front portion (in FIG. 18, the right side) of the lower plate 37. A reference face 41 which serves as the reference for automatic transfer of the semiconductor wafers "W" is formed on the lower face of the projection.

In the vertical wafer boat, when a semiconductor wafer "W" is to be transferred, the position of the corresponding wafer mount groove portion 38 is obtained on the basis of the reference face 41, thereby enabling the semiconductor wafer "W" to be automatically transferred.

In the former prior art vertical wafer boat, since the support rods have a triangular section shape, the ceramic film on the vertical edges are easily broken by a contact with another member during production or use, or concentration of thermal stress due to heat cycles during use. In such a case, there arises a problem in that impurities may be emitted from the ceramic base material and the semiconductor wafers to be treated may be adversely affected by the impurities.

When an $SiO_2$ film, an $Si_3N_4$ film, a poly-Si film, or the like is to be formed on the surfaces of semiconductor wafers by a method such as the LP-CVD method, the CVD film is formed not only on the semiconductor wafers but also on the vertical wafer boat itself. Therefore, this causes a problem in that, during a subsequent wafer transfer process or heat processing, the CVD film deposited on the vertical edges of the support rods and the upper and lower horizontal edges of the wafer mount groove portions may be peeled off to function as particles and the semiconductor wafers to be treated may be adversely affected by the particles.

In the latter prior art vertical wafer boat, since the support rods have a circular section shape, the problems produced in the former wafer boat do not occur. However, the horizontal sectional view of the wafer mount groove portions form an acute angle, and hence there arises a problem in that the ceramic film formed on the edges and the CVD film deposited on the edges may be peeled off.

The vertical wafer boats may undergo a cleaning process after each step. Usually, however, such a cleaning process is not performed, because the productivity is impaired and a part of the ceramic film may not be cleaned away.

Since both the vertical wafer boats have the four support rods, the number of portions where semiconductor wafers are supported is large. This produces a problem in that a large number of particles may be produced.

SUMMARY OF THE INVENTION

It is an object of the invention to provide a vertical wafer boat in which a ceramic film is prevented from being peeled off and the useful life is extended.

In order to solve the problems, a first aspect of the vertical wafer boat is characterized in that front and rear sets each consisting of two support rods which are bilaterally symmetrically arranged are respectively disposed in front and rear sides between upper and lower plates, a number of wafer mount groove portions are formed in at least three of the support rods, the plates and the support rods are made of a ceramic base material, outer surface of vertical wafer boat of the plates and the support rods are covered by a high-purity ceramic film, at least wafer mount groove portions of right and left support rods of the front set are located in front of a center line which is perpendicular to an insertion direction of semiconductor wafers which are to be mounted on the wafer mount groove portion, and horizontal sections of the wafer mount groove portions of the support rods have a polygonal shape, angles of which are all an obtuse angles.

A second aspect of the vertical wafer boat is characterized in that, in the first vertical wafer boat, both of upper and lower edges of the wafer mount groove portions of the support rods are chamfered.

A third aspect of the vertical wafer boat is characterized in that, in the first or second vertical wafer boat, the plates have a ring plate-like shape in which a slit elongating in the wafer insertion direction is formed in a center of a rear portion, and the wafer mount groove portions of the right and left support rods of the front and rear sets have a horizontal section of a substantially same area.

Preferably, in the support rods of the front and rear sets, a ratio of the area of the horizontal section of the wafer mount groove portion of each of the left support rods to the area of the horizontal section of the wafer mount groove portion of each of the right support rods is 1:0.95 to 1:1.05.

A fourth third aspect of the vertical wafer boat is characterized in that, in the first or second vertical wafer boat, the plates have a ring plate-like shape in which a slit elongating in the wafer insertion direction is formed in a center of a rear portion, and one of the rear right and left support rods of the rear set is replaced with a reinforcing rod having no wafer mount groove portion.

A fifth third aspect of the vertical wafer boat is characterized in that, in the fourth vertical wafer boat, the wafer mount groove portions of the right and left support rods of the front set, the wafer mount groove portions of the rear support rod, and the reinforcing rod have a horizontal section of a substantially same area.

Preferably, a ratio of the areas of the horizontal sections of the wafer mount groove portions of the support rods of the front set, and a ratio of the area of the horizontal section of the wafer mount groove portion of the rear support rod to the area of the horizontal section of the reinforcing rod are 1:0.95 to 1:1.05.

A sixth aspect of the vertical wafer boat is characterized in that, in the first aspect, upper and lower edges of said wafer mount groove portions of said support rods has chamfered surfaces, the surface roughness (Ra) of which is 0.3 to 500 $\mu$m.

In the specification, "front" means the side through which semiconductor wafers are loaded and unloaded.

As the ceramic base material, useful are SiC impregnated with metal Si (Si—SiC), self-sintered SiC in which B of 0.1 wt % or less is used as a sintering auxiliary, $Si_3N_4$, and the like. As the high-purity ceramic film, useful are a CVD-SiC film, a CVD-$Si_3N_4$ film, a CVD-$Al_2O_3$ film, an $SiO_2$ film which is formed by heating an SiC or $Si_3N_4$ base material in an oxidizing atmosphere, and the like.

When horizontal sections of the wafer mount groove portions of the support rods have a polygonal shape which has an acute angle of 90° or less, a ceramic film or a deposited CVD film may be peeled off by an impact force or thermal stress.

Preferably, all edges of a horizontal section of each wafer mount groove portion of the support rods have a polygonal shape which has an obtuse angle of 100° or more.

The chamfering process may be performed by a sandblast process or the like. Preferably, the chamfered portions have a surface roughness(Ra) of 0.3 to 500 $\mu$m. The chamfered portions may be configured as either of a flat chamfered face and a rounded face. Roughness(Ra) is defined as arithmetic mean deviation of the roughness prosile, by JIS B0601 (1982).

When the ratio of the areas of horizontal sections of the wafer mount groove portions of the support rods is outside the range of 1:0.95 to 1:1.05, the upper and lower plates may be thermally distorted, and the boat is finally deformed or broken.

The reinforcing rod is made of a ceramic base material which is similar to that of the plates and the support rods. The surface of the reinforcing rod is covered by a high-purity ceramic film in the same manner as the plates and rods.

DESCRIPTION OF THE PREFERRED EMBODIMENTS

Hereinafter, embodiments of the invention will be described with reference to the accompanying drawings.

Figure 1:
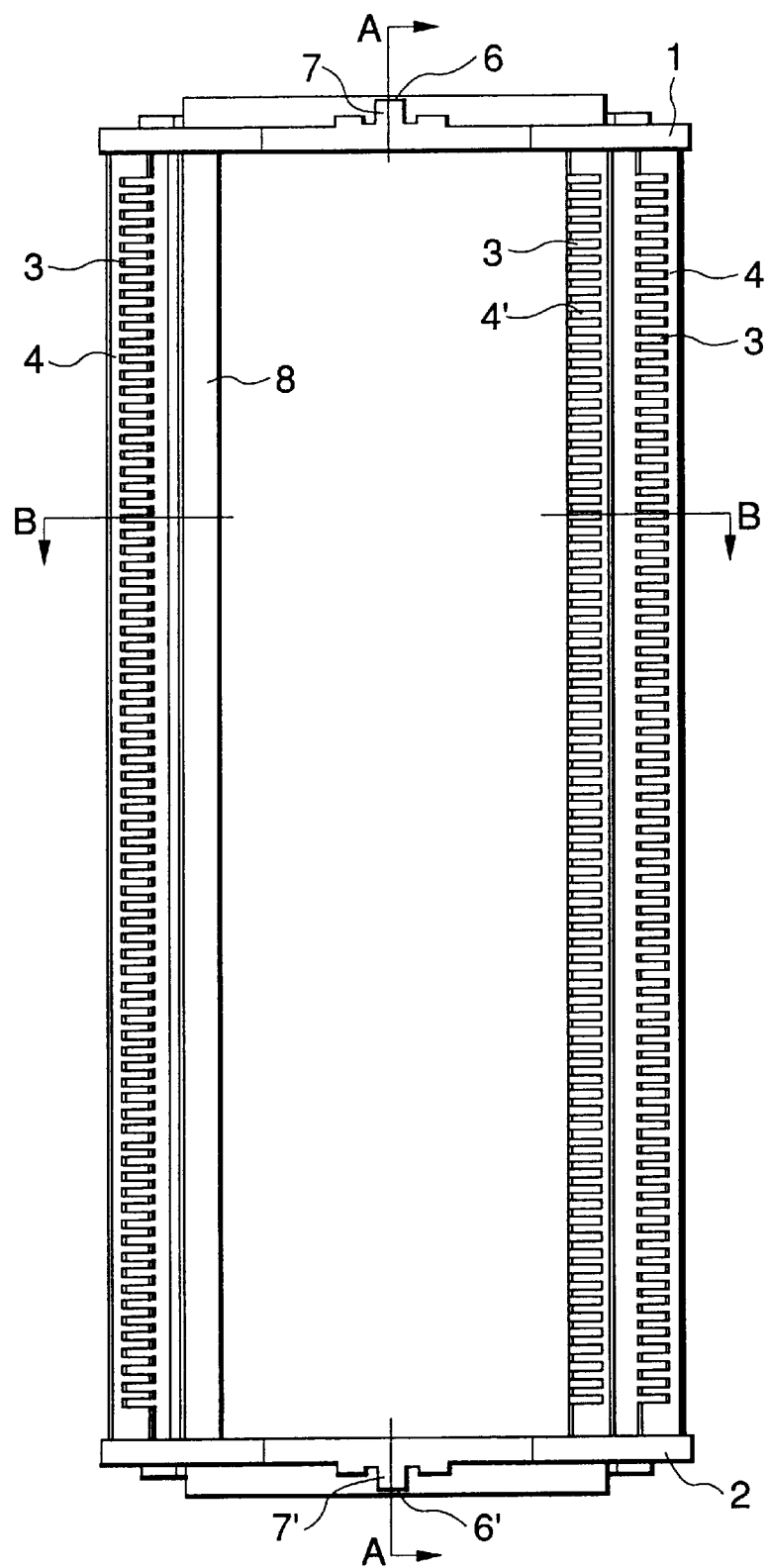
FIG. 1 is a front view showing a first embodiment of the vertical wafer boat of the invention.
Figure 2:
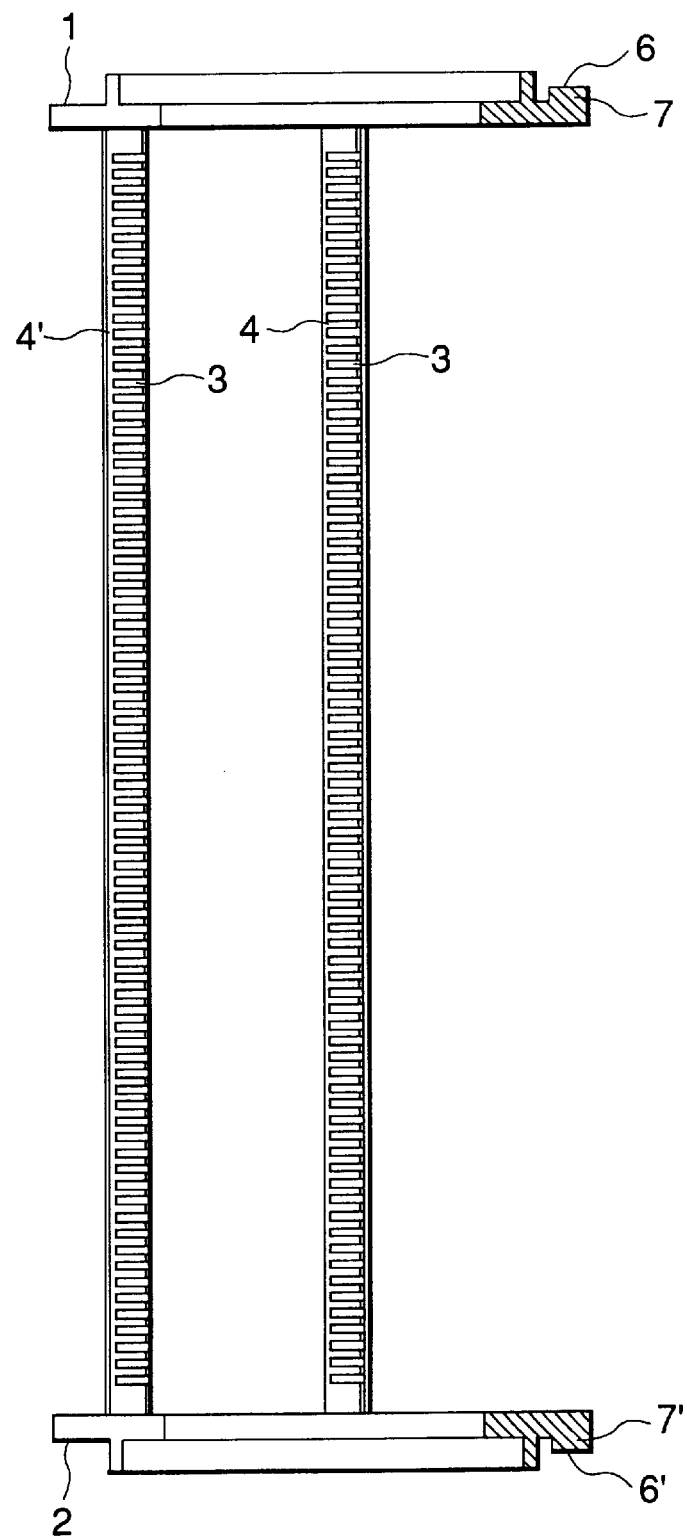
FIG. 2 is a section view taken along the line A—A of FIG. 1.
Figure 3:
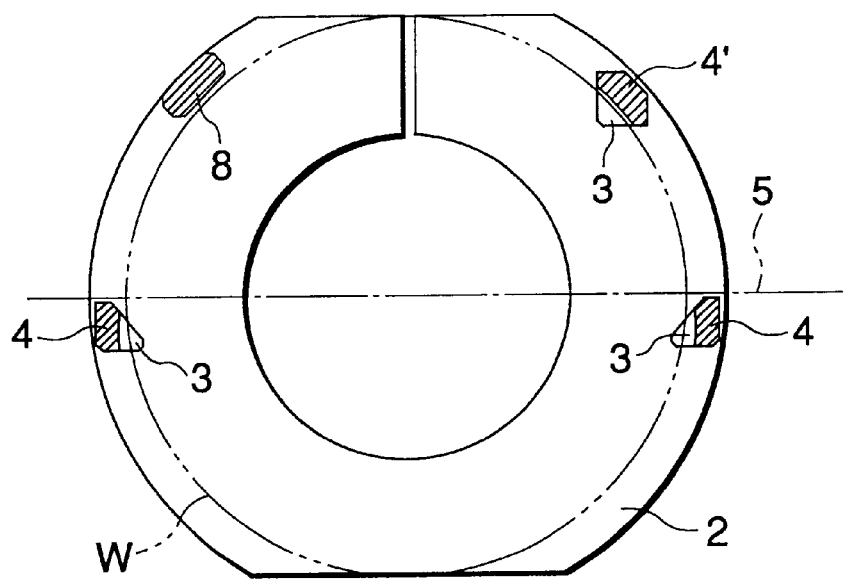
FIG. 3 is a section view taken along the line B—B of FIG. 1.

FIG. 1 is a front view showing a first embodiment of the vertical wafer boat of the invention, FIG. 2 is a section view taken along the line A—A of FIG. 1, and FIG. 3 is a section view taken along the line B—B of FIG. 1.

In the figures, 1 and 2 designate upper and lower plates which are separated from each other, respectively. The plates 1 and 2 have a ring plate-like shape in which a slit elongating in the wafer insertion direction (in FIG. 3, from the lower side to the upper side) of semiconductor wafers "W" is formed in the center of the rear portion (in FIG. 3, the upper side), and are formed from a ceramic base material of Si—SiC, the surface of which is covered by a high-purity ceramic film of CVD-SiC.

Between the upper and lower plates 1 and 2, two support rods 4 in which a number of wafer mount groove portions 3 are formed so as to horizontally elongate and to be vertically arranged at constant intervals are bilaterally (in FIG. 3, in rightward and leftward directions) symmetrically disposed, with directing the wafer mount groove portions 3 toward the center of the plate 2(1). The support rods 4 are located in front of the center line 5 of the plate 2(1), which is perpendicular to the wafer insertion direction (in FIG. 3, in downward direction)of semiconductor wafers "W" which are to be mounted. A reinforcing rod 8 having no wafer mount groove portion, and another support rod 4' configured in the same manner as the support rods 4,4' are bilaterally symmetrically disposed so as to be closer to the rear inner side. In the same manner as the plates 1 and 2, these support rods 4,4' and the reinforcing rod 8 are formed from a ceramic base material of Si—SiC the outer surface of which is covered with a high-purity ceramic film of CVD-SiC.

Figure 4:
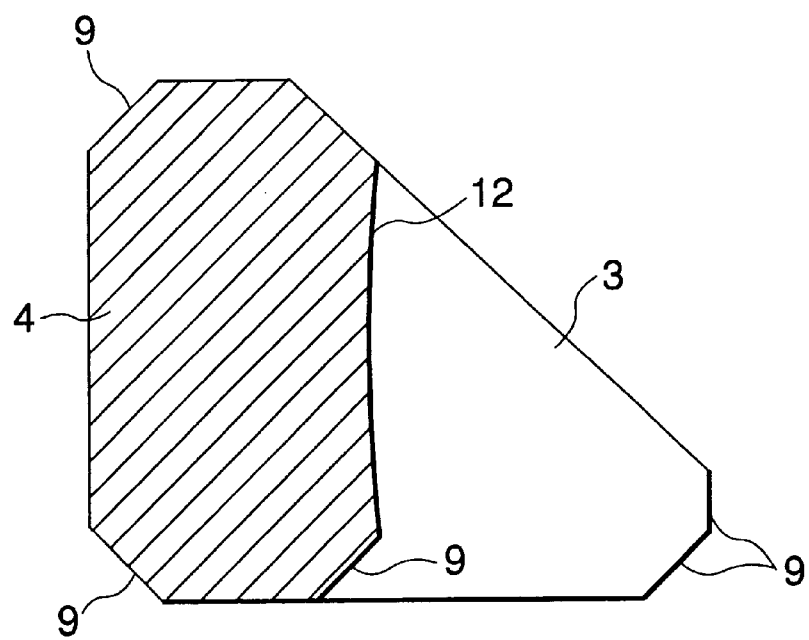
FIG. 4 is a cross section view of a front support rod having wafer mount groove portions in the vertical wafer boat of FIG. 1.

Among the support rods 4,4', the front two support rods 4 have a rectangular triangle-like section shape. In each of the support rods, the rectangular portion is located in the front outer side, and the walls 12 of the wafer mount groove portions 3 extend in substantially parallel with the wafer insertion direction. The rear one support rod 4 has a square section shape, and is located so that one side face is opposed to the wafer insertion direction. In the rear one support rod, the walls 12 of the wafer mount groove portions 3 extend along a circle which is centered at the center of the plates 1 and 2. The reinforcing rod 8 has a rectangular section shape, and one side face extends along the circle which is centered at the center of the plates 1 and 2. As shown in FIGS. 3 and 4, an oblique chamfer 9 is formed on the vertical edges of the support rods 4,4' and the reinforcing rod 8 (including the vertical edges of the wafer mount groove portions), and the horizontal sections of the wafer mount groove portions 3 of the support rods 4 and the horizontal section of the reinforcing rod 8 have a polygonal shape which does not have an acute angle of 90° or less.

In each of the support rods 4, a wall 12 which is to abut against the side face of a wafer may have either of a rounded face corresponding to the outer peripheral shape of the wafer, and a flat shape.

In order to prevent deformation or breakage of the plates 1 and 2 due to a difference in thermal expansion from occurring, the areas of the horizontal sections of the wafer mount groove portions 3 of the right and left support rods 4 of the front pair are substantially equal to each other. And the areas of the horizontal sections of the wafer mount groove portions 3 of the rear support rods 4' and the area of the horizontal section of the reinforced rod 8 are substantially equal to each other. In other words, the area ratio of the right and left support rods (the reinforced rod)is set to be in the range of 1:0.95 to 1:1.05, respectively.

The upper and lower plates 1 and 2 are provided with projections 7 and 7' having reference faces 6 and 61 for automatic wafer transfer which are formed on the upper and lower sides of the wafer insertion side, respectively.

In the thus configured vertical wafer boat, the horizontal sections of the wafer mount groove portions 3 of the support rods 4,4' and the horizontal section of the reinforcing rod 8 have a polygonal shape which does not have an acute angle of 90° or less. Even when an impact force or thermal stress acts on an edge, therefore, a ceramic film or a deposited CVD film is hardly peeled off, so that the useful life is extended and particles are prevented from being produced.

The reinforcing rod 8 may be changed into the support rods 4'. Even in the case four support rods are used, when a semiconductor wafer "W" is inserted into the wafer mount groove portions of the four support rods, however, the semiconductor wafer "W" are substantially in contact with only three wafer mount groove portions because the wafer mount groove portions 3 have a low surface accuracy. Therefore, three support rods 4,4' having the wafer mount groove portions 3 are used, and the remaining one support rod is replaced with the reinforcing rod 8 having no wafer mount groove portion. According to this configuration, the strength of the vertical wafer boat 5 can be ensured and hence the other support rods 4,4' can be prevented from being broken. During processes of inserting and transferring semiconductor wafers "W" into or from the wafer mount groove portions 3 in a step of vapor phase growth for wafers, a CVD film which has been deposited on the wafer mount groove portions 3 rubs with the wafers and particles are produced. Since the number of the, 4's 4 having the wafer mount groove portions 3 is reduced by one, the production of particles can be suppressed by the degree corresponding to one support rod 4'.

The upper and lower plates 1 and 2 which have the substantially same shape have the configuration in which the projections 7 and 7' having reference faces 6 and 6' for automatic wafer transfer are formed at the most front position of the insertion side of the semiconductor wafers "W" and on the upper and lower sides of the wafer insertion side, respectively. Thereby the boat can be used in a same manner, in the case that upper side is converted into lower side of the boat. Namely, during a process such as oxidation of the semiconductor wafers, diffusion, or vapor phase growth, when semiconductor wafers are automatically mounted into the wafer mount groove portions 3 with using the lower reference face 6' as the reference, semiconductor wafers are repeatedly contacted with the wafer mount groove portions 3 and the groove faces are damaged or roughened, with the result that particles are produced or the semiconductor wafers are damaged, thereby causing the life of the wafer boat to expire. Even when such a case occurs, the above-mentioned configuration allows the life of the vertical wafer boat 5 to be largely extended by inverting the vertical wafer boat 5 and then performing the automatic mounting of semiconductor wafers into the wafer mount groove portions 3.

Figure 5:
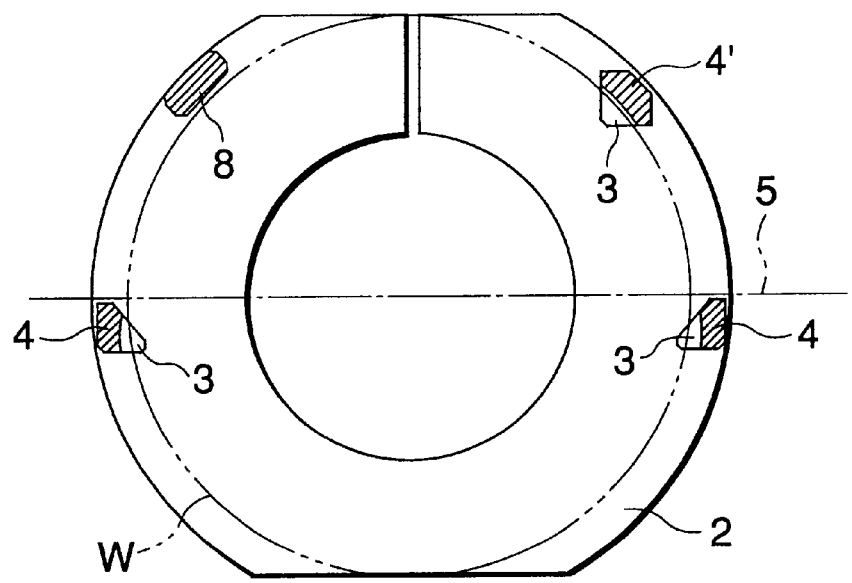
FIG. 5 is a cross section view showing a second embodiment of the vertical wafer boat of the invention.
Figure 6:
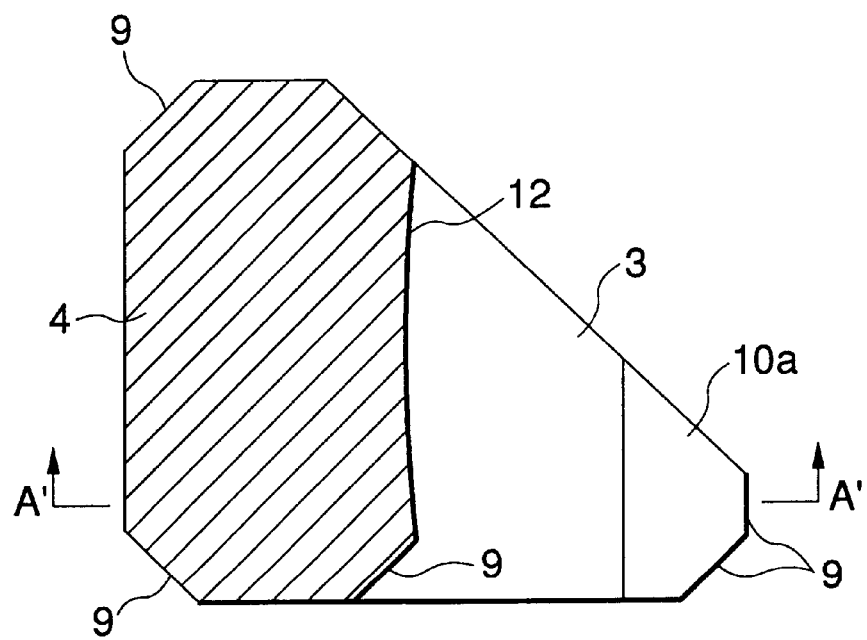
FIG. 6 is a partial enlarged view of a front support rod having wafer mount groove portions in the wafer boat of FIG. 5.
Figure 7:
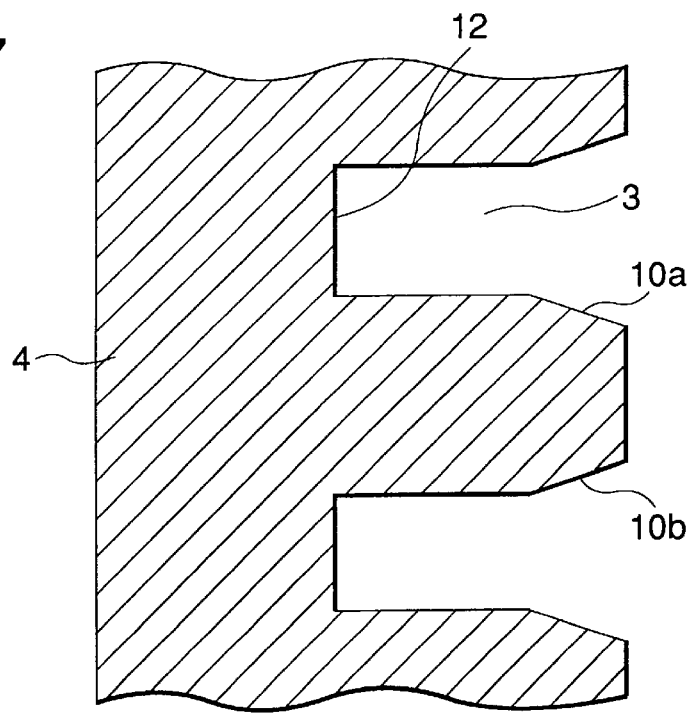
FIG. 7 is a section view taken along the line A'—A' of FIG. 6.

FIG. 5 is a cross section view showing a second embodiment of the vertical wafer boat of the invention, FIG. 6 is a partial enlarged view of a front support rod having wafer mount groove portion in the wafer boat of FIG. 5, and FIG. 7 is a section view taken along the line A'—A' of FIG. 6.

In the vertical wafer boat, chamfers 10a and 10b are formed on the opening edges, i.e., the upper and lower horizontal edges of wafer mount groove portions 3 by a sandblast process or the like, and have a surface roughness (Ra) of 0.3 to 500 $\mu$m. In this embodiment surface roughness (Ra) of the chamfered portions is 1 $\mu$m. In the case that a surface roughness (Ra) of the chamfered portions is less than 0.3 $\mu$m, the CVD film deposited thereon is easy to be peeled off to function as particles and the semiconductor wafers to be treated may be adversely affected by the particles. In the case that a surface roughness(Ra) of the chamfered portions is more than 500 $\mu$m, surface of the CVD film deposited thereon become sharp and the CVD film is easy to be peeled off by being contacted by the wafers.

The other portions are configured in the same manner as those of the first embodiment. The same components are designated by the same reference numerals and their description is omitted.

Therefore, the vertical wafer boat can attain the same effects as those of the first embodiment, and another effects that a ceramic film of the upper and lower horizontal edges of the wafer mount groove portions 3, and a deposited CVD film are hardly peeled off by an impact force or thermal stress. As a result, the useful life can be further extended and particles can be prevented from being produced.

Figure 8:
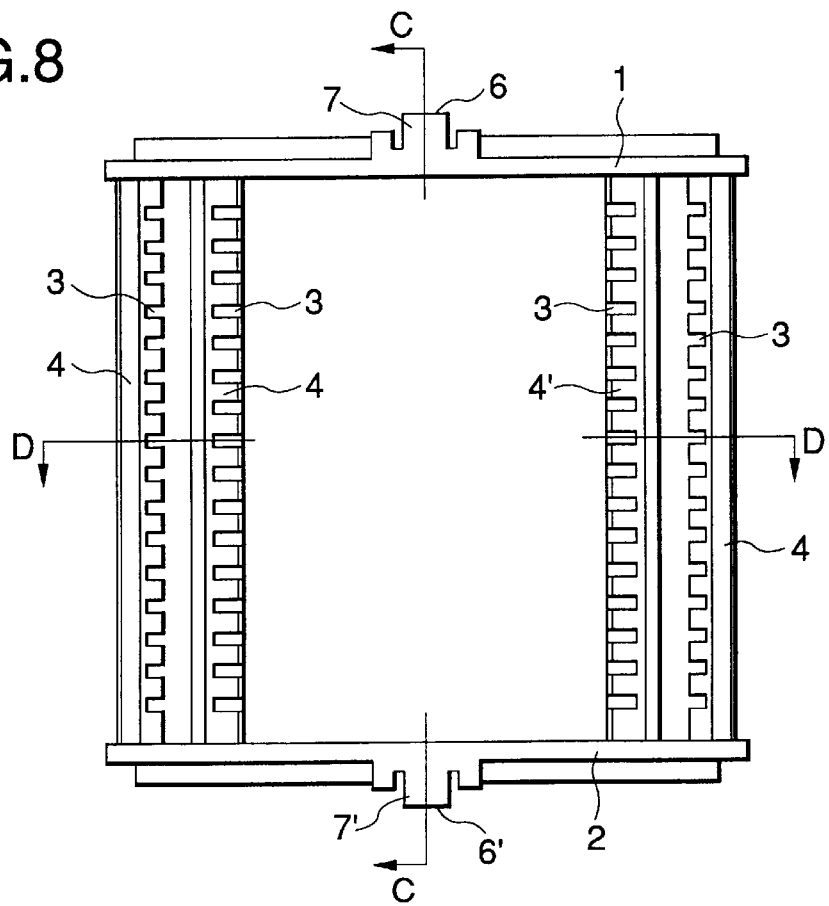
FIG. 8 is a front view showing a third embodiment of the vertical wafer boat of the invention.
Figure 9:
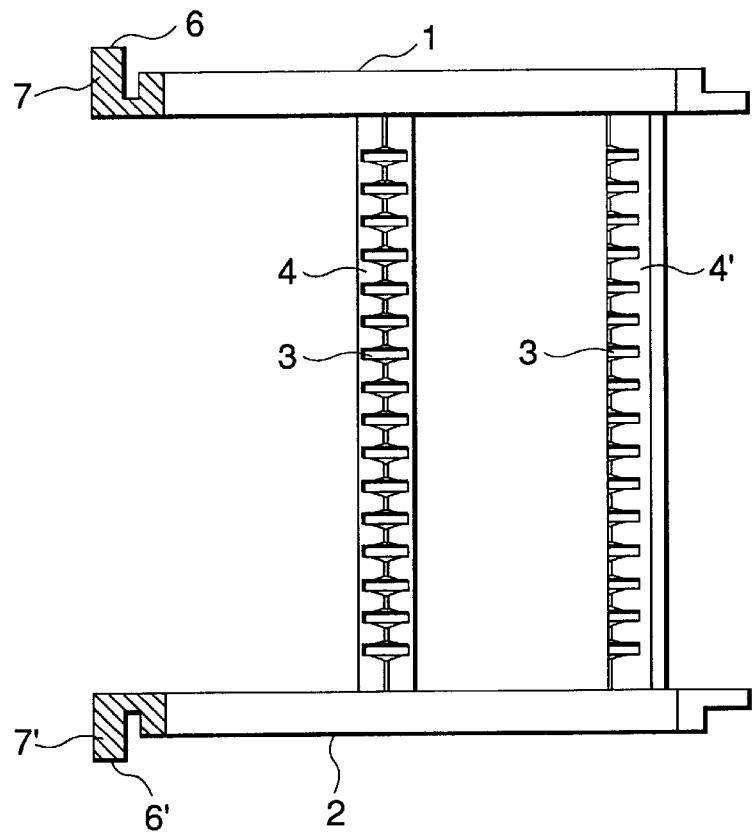
FIG. 9 is a section view taken along the line C—C of FIG. 8.
Figure 10:
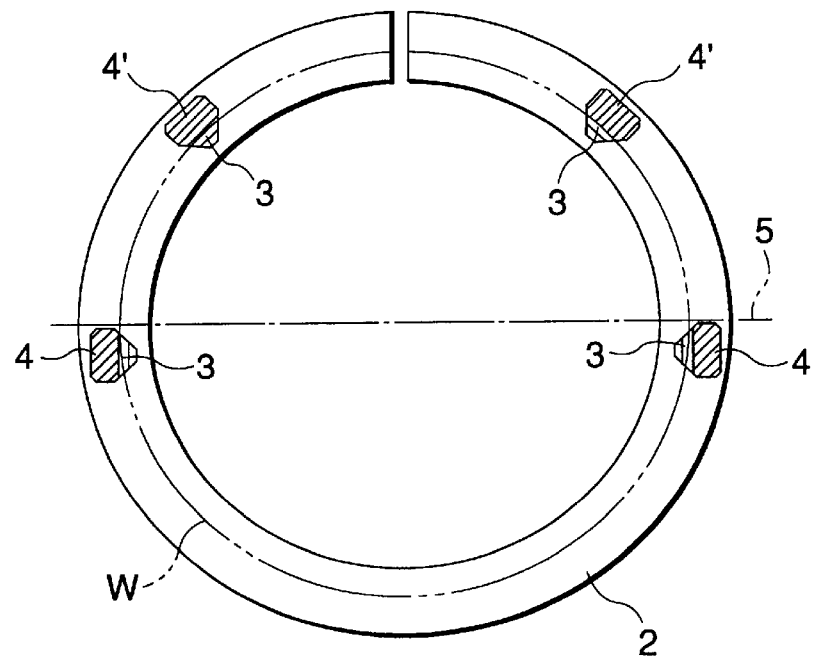
FIG. 10 is a section view taken along the line D—D of FIG. 8.

FIG. 8 is a front view showing a third embodiment of the vertical wafer boat of the invention, FIG. 9 is a section view taken along the line C—C of FIG. 8, and FIG. 10 is a section view taken along the line D—D of FIG. 8.

In the same manner as the first and second embodiments, upper and lower plates 1 and 2 have a ring plate-like shape in which a slit elongating in the insertion direction (in FIG. 10, from the lower side to the upper side) of semiconductor wafers W is formed in the center of the rear portion (in FIG. 10, the upper side), and are formed from a ceramic base material of Si—SiC the surface of which is covered by a high-purity ceramic film of CVD-SiC.

Figure 11:
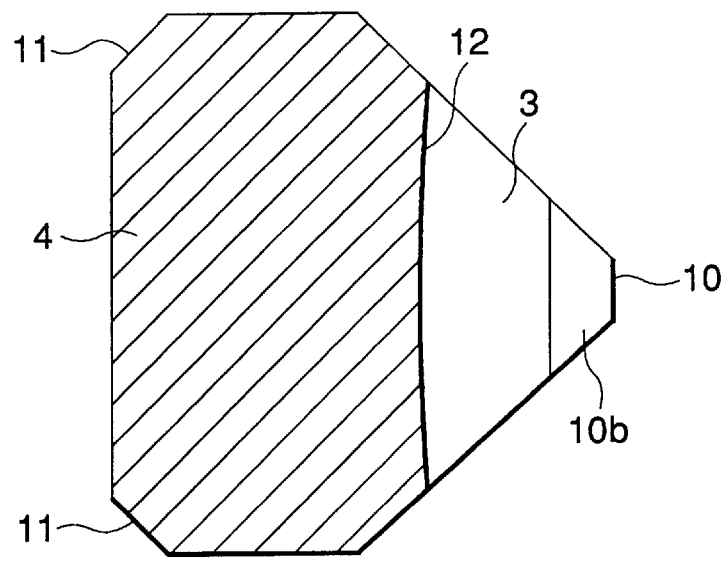
FIG. 11 is a cross section view of a support rod having wafer mount groove portions in the vertical wafer boat of FIG. 8.
Figure 12:
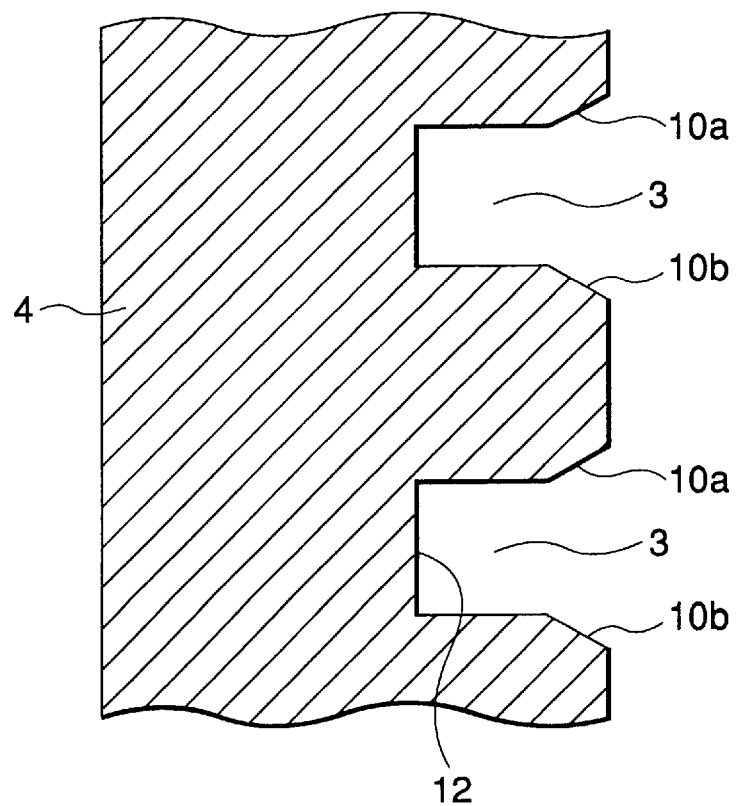
FIG. 12 is a partial longitudinal section view of a wafer mount groove portion of a support rod in the vertical wafer boat of FIG. 8.

Between the upper and lower plates 1 and 2, four support rods 4,4' in which a number of wafer mount groove portions 3 are formed so as to horizontally elongate and to be vertically arranged at constant intervals are disposed in such a manner that the wafer mount groove portions 3 are directed toward the centers of the plates 1 and 2, two pairs of the support rods are disposed in the front (in FIG. 10, the lower side) and rear side, and, in each of the pairs, the support rods are bilaterally (in FIG. 10, in rightward and leftward directions) symmetrical. The support rods 4 of the front pair are located in front of the center line of the plates 1 and 2 which horizontally perpendicular intersects ran with the insertion direction of semiconductor wafers "W" which are to be mounted. The support rods 4,4' are formed from a ceramic base material of Si—SiC the surface of which is covered by a high-purity ceramic film of CVD-SiC. As shown in FIG. 11, all the four support rods have a deformed pentagonal section shape in which the front face side has a triangular shape and the rear face side has a rectangular shape. The front face side is directed to the center of the plates 1 and 2, and the walls 12 of the wafer mount groove portions 3 extend along a circle which is centered at the center of the plates 1 and 2. In each of the support rods 4,4', chamfers 10, 11, 10a, and 10b are formed on the opening edges, i.e., the upper and lower horizontal edges of the wafer mount groove portions 3 by a sandblast process or the like, the horizontal sections of the wafer mount groove portions 3 of the support rod 4,4' have a polygonal shape which does not have an acute angle of 90° or less, and the chamfers 10, 11, 10a, and 10b have a surface roughness(Ra) of 0.3 to 500 μm.

In order to prevent deformation or breakage of the plates 1 and 2 due to a difference in thermal expansion of the support rods 4,4' from occurring, the areas of the horizontal sections of the wafer mount groove portions 3 of the right and left support rods 4,4' of the front and rear pairs are substantially equal to each other. In other words, the area ratio of the right and left support rods is set to be in the range of 1:0.95 to 1:1.05.

In the same manner as the first embodiment, in the upper and lower plates 1 and 2, the projections 7 and 7' having reference faces 6 and 6' for automatic wafer transfer are formed on the upper and lower sides of the wafer insertion side, respectively.

The configuration of the above-described vertical wafer boat is identical with that of the second embodiment except that all the support rods 4,4' are configured in the same manner, and hence the vertical wafer boat can attain effects which are substantially same as those of the second embodiment.

Figure 13:
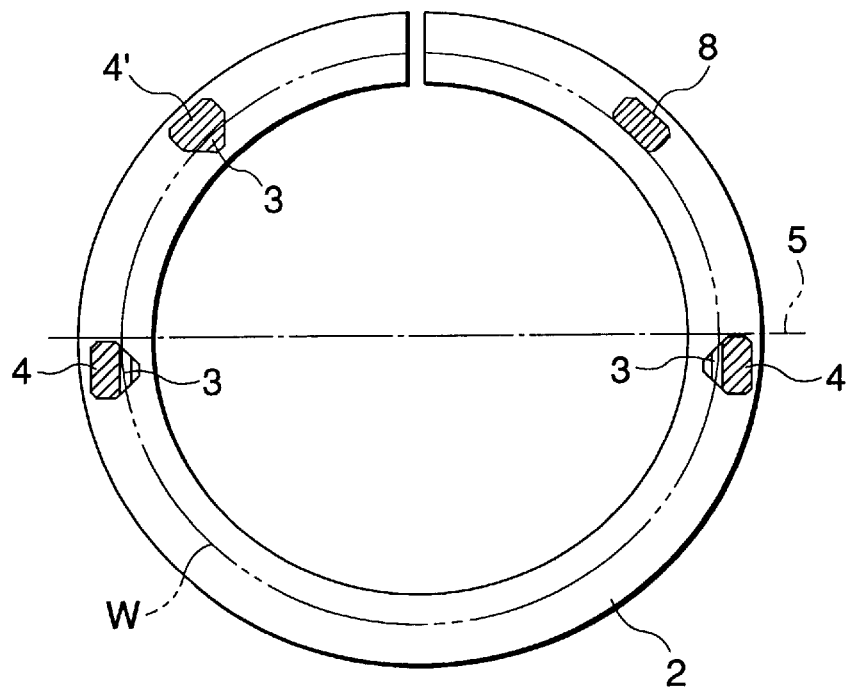
FIG. 13 is a cross section view showing a fourth embodiment of the vertical wafer boat of the invention.

FIG. 13 is a cross section view showing a fourth embodiment of the vertical wafer boat of the invention.

In the same manner as the first and second embodiments, in the vertical wafer boat, one of the rear two support rods 4 is replaced with the reinforcing rod 8.

The other configuration and the effects are identical with those of the third embodiment. The same components are designated by the same reference numerals and their description is omitted. In this embodiment surface roughness(Ra)of the chamfered portions is 2 μm.

Figure 14:
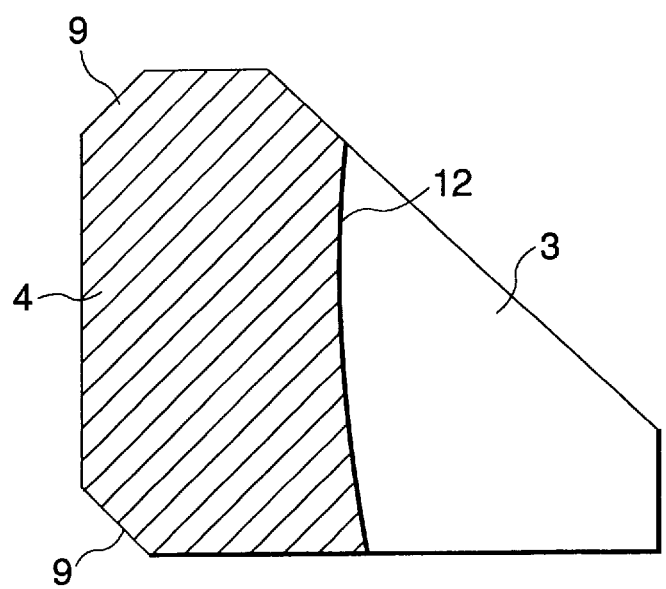
FIG. 14 is a cross section view of a support rod of a comparison example of a vertical wafer boat.
Figure 15:
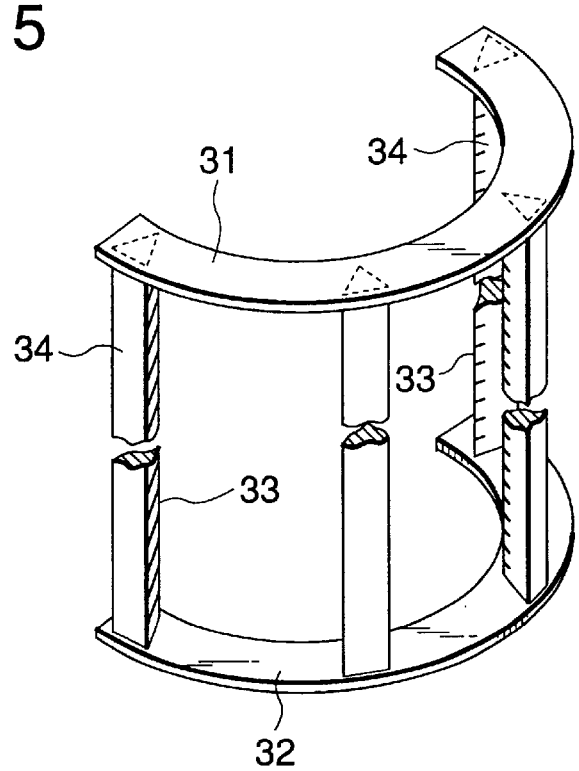
FIG. 15 is a perspective view showing a vertical wafer boat of the prior art.
Figure 16:
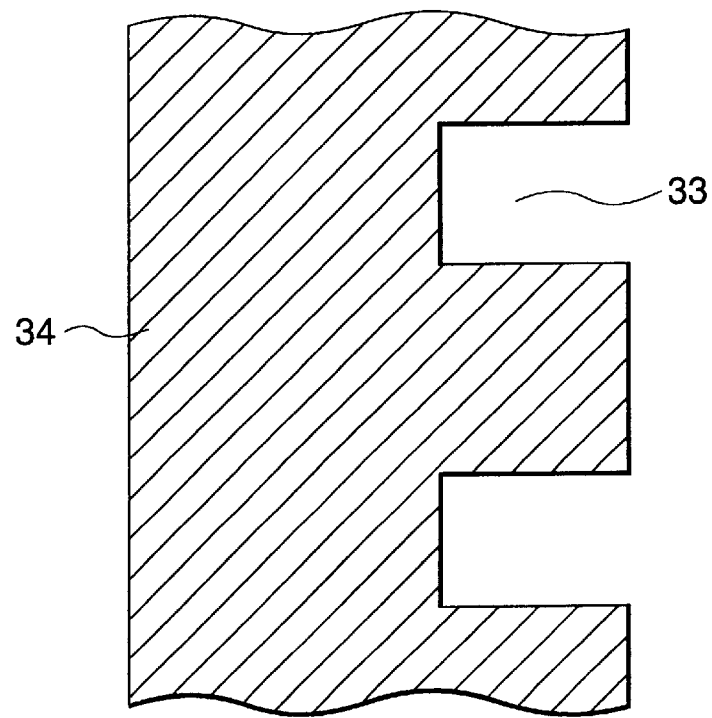
FIG. 16 is a partial longitudinal section view of a wafer mount groove portion of a support rod in the vertical wafer boat of FIG. 15.
Figure 17:
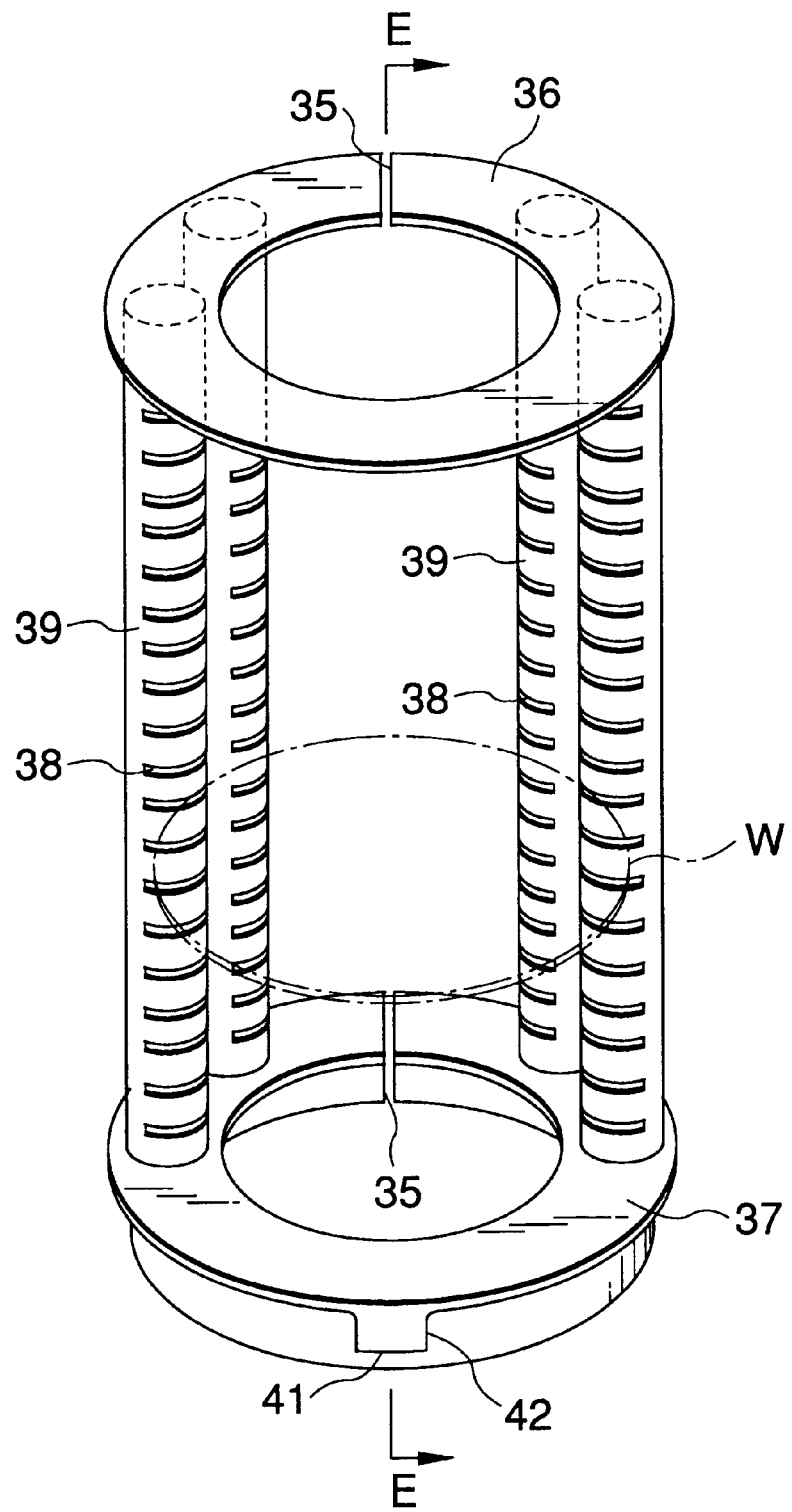
FIG. 17 is a perspective view showing another vertical wafer boat of the prior art.
Figure 18:
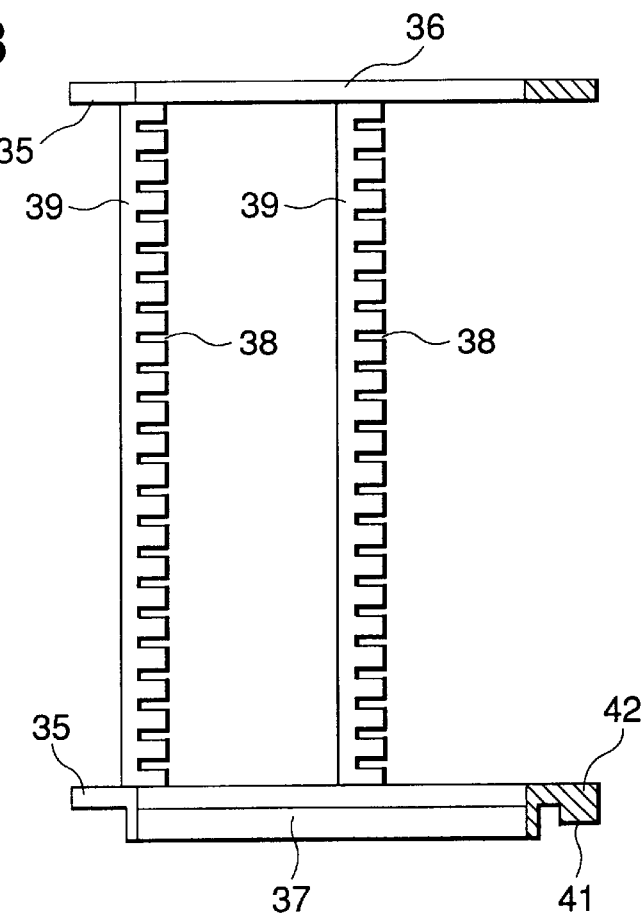
FIG. 18 is a section view taken along the line E—E of FIG. 17.
Figure 19:
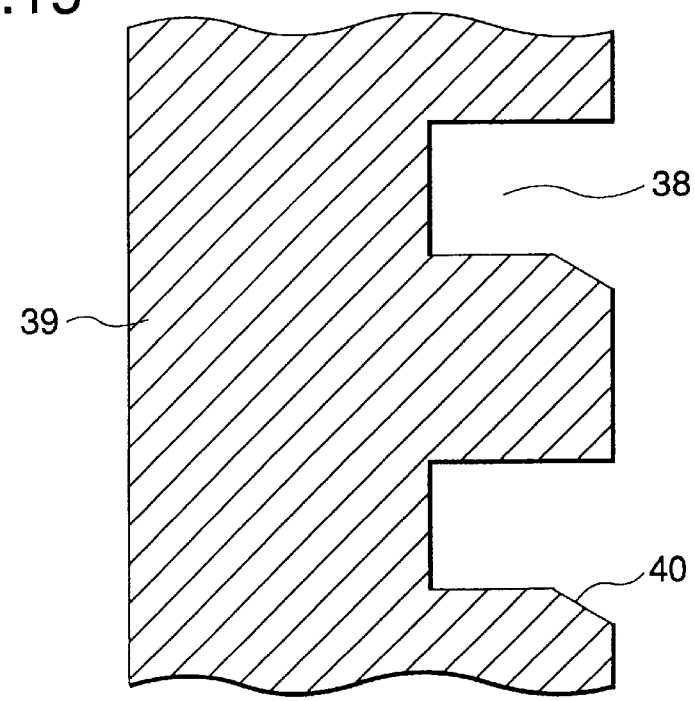
FIG. 19 is a partial longitudinal section view of a wafer mount groove portion of a support rod in the vertical wafer boat of FIG. 17.

Silicon wafers in which a thermal oxide film ($SiO_2$) of 100 nm is formed on the surface were prepared. Under the LP-CVD conditions listed below, 50 pieces of the silicon wafers were mounted on each of the following vertical wafer boats and then a P(Phosphorous)-doped polysilicon film of 150 nm was formed on the surfaces of the wafers:

(1) the vertical wafer boat of the second embodiment;
(2) the vertical wafer boat of the fourth embodiment;
(3) a vertical wafer boat which, in the same manner as these vertical wafer boats, is formed from a ceramic base material of Si—SiC the surface of which is covered by a high-purity ceramic film of CVD-SiC, and in which the support rods 4,4' have vertical edges of an acute angle of 90° or less as shown in FIG. 14, and the horizontal edges of the wafer mount groove portions 3 are not chamfered;
(4) a vertical wafer boat which has the shape shown in FIG. 15 and, in the same manner as that of the embodiment, is formed from a ceramic base material of Si—SiC the surface of which is covered by a high-purity ceramic film of CVD-SiC; and
(5) a vertical wafer boat which has the shape shown in FIG. 18 and, in the same manner as that of the embodiment, is formed from a ceramic base material of Si—SiC the surface of which is covered by a high-purity ceramic film of CVD-SiC.

In the vertical wafer boats (1) and (2), there arose no problem even after the LP-CVD process was repeated 1,000 times. By contrast, in the vertical wafer boat (3), cracks were formed in the CVD-SiC film of the boat when the LP-CVD process was repeated 700 times; in the vertical wafer boat (4), cracks were formed in the CVD-SiC film of the boat when the LP-CVD process was repeated 300 times; and, in the vertical wafer boat (5), particles due to the poly-Si film were increased when the LP-CVD process was repeated 500 times, and cracks were formed in the CVD-SiC film of the boat when the LP-CVD process was repeated 650 times. All of the boats (3) to (5) were required to be replaced with a new one.

LP-CVD conditions:

A 50 silicon wafer (on the surface of which a thermal oxide film of 100 nm is formed) are mounted on a boat;

B the boat is inserted into an LP-CVD furnace of the atmospheric pressure and 500° C.;

C while $N_2$ gas is purged, the pressure is reduced to 0.3 Torr and the temperature is raised to 650° C.;

D a mixture of $SiH_4$ (monosilane) gas of a concentration of 80% or higher, He gas, and $PH_3$ (hydrogen phosphide) gas is charged, and a P (phosphorus)-doped poly-Si film of a thickness of 150 nm is formed;

E the supply of $SiH_4$ gas, He gas, and $PH_3$ gas is stopped, and $N_2$ gas is purged;

F the pressure is returned to the atmospheric pressure, and the temperature is lowered to 500° C.; and G the boat is removed out of the LP-CVD furnace.

Therefore, it will be seen that the vertical wafer boat of the invention is excellent in useful life.

As described above, according to the first aspect of vertical wafer boat of the invention, the horizontal sections of the wafer mount groove portions of the support rods have a polygonal shape which does not have an acute angle of 90° or less. Even when an impact force or thermal stress acts on a vertical edge, therefore, a ceramic film or a deposited CVD film is hardly peeled off, so that the useful life is extended and particles is prevented from being produced.

According to the second aspect of vertical wafer boat, the same effects as those of the first aspect can be attained, and a ceramic film of the portions and a deposited CVD film are hardly peeled off because the upper and lower horizontal edges of the wafer mount groove portions are chamfered, with the result that the useful life can be further extended and particles can be prevented from being produced.

According to the third aspect of vertical wafer boat, the same effects as those of the first and second aspect can be attained. Further, difference in thermal expansion among the support rods is reduced and the plates are prevented from being deformed or broken, thereby extending the useful life.

According to the fourth aspect of vertical wafer boat, the same effects as those of the first and second aspects can be attained, and, without producing any effect on the mounting held state of semiconductor wafers, the strength of the vertical wafer boat can be ensured and the support rods can be prevented from being broken. Furthermore, since the number of the support rods having the wafer mount groove portions which function as a source of particles is reduced by one, the production of particles can be suppressed by the degree corresponding to one support rod, and the life can be extended.

According to the fifth aspect of vertical wafer boat, the same effects as those of the fourth aspect can be attained, and size difference between the support rods and the reinforcing rod, which is caused by a difference between the rate of expansion of the support rods and that of the reinforcing rod, are reduced so that the plates can be prevented from being deformed or broken, thereby extending the useful life.

According to the sixth aspect of vertical wafer boat, the same effects as those of the first aspect can be attained, and an adhesivity of the deposited CVD film is improved and a deposited CVD film are hardly peeled off because upper and lower edges of said wafer mount groove portions of said support rods has chamfered surfaces the surface roughness (Ra) of which is 0.3 to 500 $\mu$m, with the result that the useful life can be further extended and particles can be prevented from being produced.

What is claimed is:

1. A vertical wafer boat comprising:

upper and lower plates; and front and rear sets each consisting of two support rods which are bilaterally symmetrically arranged are respectively disposed in front and rear sides between upper and lower plates, a number of wafer mount groove portions are formed in at least three of said support rods, wherein said plates and said support rods are made of a ceramic base material, outer surface of the vertical wafer boat made of said plates and said support rods are covered by a high-purity ceramic film, at least wafer mount groove portions of right and left support rods of said front set are located in front of a center line which is perpendicular to an insertion direction of semiconductor wafers which are to be mounted on said wafer mount groove portion, and horizontal sections of said wafer mount groove portions of said support rods have a polygonal shape, angles of which are all obtuse.

2. The vertical wafer boat according to claim 1, wherein upper and lower edges of said wafer mount groove portions of said support rods are chamfered.

3. The vertical wafer boat according to claim 1, wherein said plates have a ring plate-like shape in which a slit elongating in the wafer insertion direction is formed in a center of a rear portion, and said wafer mount groove portions of said right and left support rods of said front and rear sets have a horizontal section of a substantially same area.

4. The vertical wafer boat according to claim 3, wherein, in said support rods of said front and rear sets, a ratio of the area of the horizontal section of said wafer mount groove portion of each of said left support rods to the area of the horizontal section of said wafer mount groove portion of each of said right support rods is 1:0.95 to 1:1.05.

5. The vertical wafer boat according to claim 1, wherein said plates have a ring plate-like shape in which a slit elongating in the wafer insertion direction is formed in a center of a rear portion, and one of said rear right and left support rods of said rear set is constituted by a reinforcing rod having no wafer mount groove portion.

6. The vertical wafer boat according to claim 5, wherein said wafer mount groove portions of said right and left support rods of said front set, said wafer mount groove portions of said rear support rod, and said reinforcing rod have a horizontal section of a substantially same area.

7. The vertical wafer boat according to claim 6, wherein a ratio of the areas of the horizontal sections of said wafer mount groove portions of said support rods of said front set, and a ratio of the area of the horizontal section of said wafer mount groove portion of said rear support rod to the area of the horizontal section of said reinforcing rod are 1:0.95 to 1:1.05.

8. The vertical wafer boat according to claim 2, wherein upper and lower edges of said wafer mount groove portions of said support rods has chamfered surfaces the surface roughness (Ra) of which is 0.3 to 500 $\mu$m.

* * * * *